United States Patent [19]

Alcorn et al.

[11] 4,062,720
[45] Dec. 13, 1977

[54] PROCESS FOR FORMING A LEDGE-FREE ALUMINUM-COPPER-SILICON CONDUCTOR STRUCTURE

[75] Inventors: George Edward Alcorn, Silver Spring, Md.; James Downer Feeley, Marshall; Julian Turner Lyman, Manassas, both of Va.

[73] Assignee: International Business Machines Corporation, Armonk, N.Y.

[21] Appl. No.: 716,861

[22] Filed: Aug. 23, 1976

[51] Int. Cl.² .......................................... H01L 21/324
[52] U.S. Cl. ...................................... 156/643; 29/590; 29/591; 156/646; 156/656; 156/657; 156/662; 156/665; 204/192 E; 427/90; 427/93
[58] Field of Search .................... 252/79.1; 156/3, 17, 156/7, 643, 646, 653, 656, 657, 662, 667; 29/578, 590, 591, 571, 582; 204/192 E, 192 EC; 357/67, 73; 427/90, 91, 93

[56] References Cited

U.S. PATENT DOCUMENTS

| | | | |
|---|---|---|---|
| 3,777,364 | 12/1975 | Schinella et al. | 29/590 |
| 3,795,557 | 3/1974 | Jacob | 252/79.1 |
| 3,871,067 | 3/1975 | Bogardus | 29/580 |
| 3,881,971 | 5/1975 | Greer et al. | 156/17 |
| 3,918,149 | 11/1975 | Roberts | 29/590 |
| 3,942,243 | 3/1976 | Murray | 29/590 |
| 3,971,684 | 7/1976 | Muto | 252/79.1 |

OTHER PUBLICATIONS

Tsang, "Forming Thick Metal Silicide for Contact Barrier," IBM Technical Disclosure Bulletin, vol. 19, No. 9, (Feb. 1977), pp. 3383-3385.

*Primary Examiner*—Charles E. Van Horn
*Assistant Examiner*—Jerome W. Massie
*Attorney, Agent, or Firm*—John E. Hoel

[57] ABSTRACT

A process is disclosed for forming a ledge-free aluminum-copper silicon conductor structure that is free of the silicon bridging problem which has produced electrical shorting conditions in the prior art. The process comprises the steps of depositing the aluminum-copper metallurgy, depositing a photoresist layer to delineate the shape of the resulting conductors, etching the aluminum copper metallurgy with phosphoric/nitric acid, for example, removing the photoresist, evaporating a layer of silicon on the surface of the etched conductor layer, sintering the composite to drive the necessary amount of silicon into the aluminum-copper, and removing the residual silicon layer by a reactive plasma etching technique. The resulting conductor structure is free of silicon bridging.

16 Claims, 7 Drawing Figures

PROCESS FLOW DIAGRAM

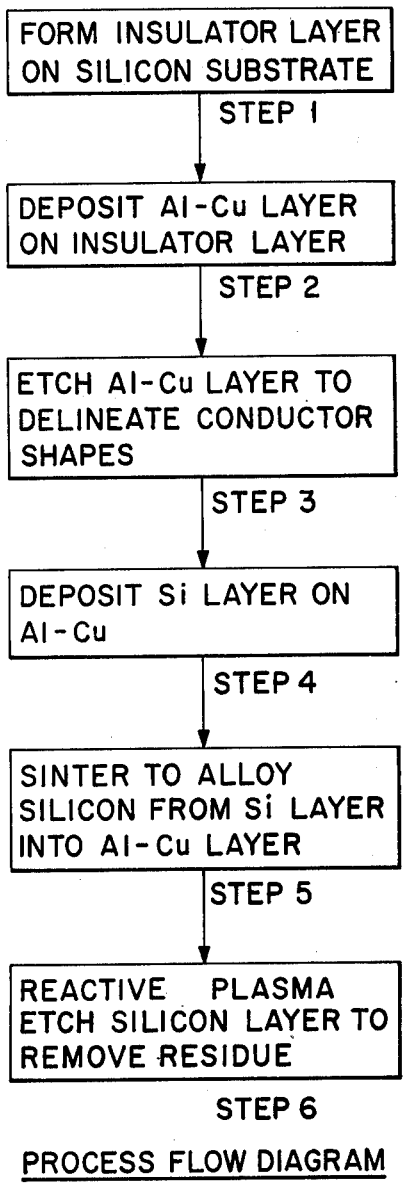
FIG. 1 — Process Flow Diagram
- STEP 1: FORM INSULATOR LAYER ON SILICON SUBSTRATE
- STEP 2: DEPOSIT Al-Cu LAYER ON INSULATOR LAYER
- STEP 3: ETCH Al-Cu LAYER TO DELINEATE CONDUCTOR SHAPES
- STEP 4: DEPOSIT Si LAYER ON Al-Cu
- STEP 5: SINTER TO ALLOY SILICON FROM Si LAYER INTO Al-Cu LAYER
- STEP 6: REACTIVE PLASMA ETCH SILICON LAYER TO REMOVE RESIDUE
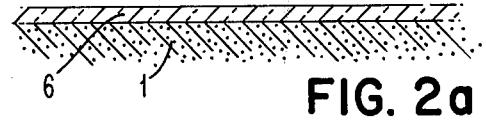
FIG. 2a
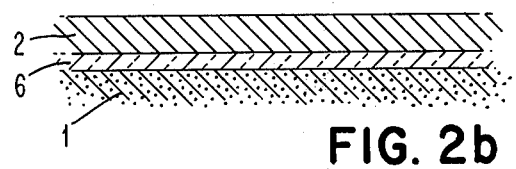
FIG. 2b
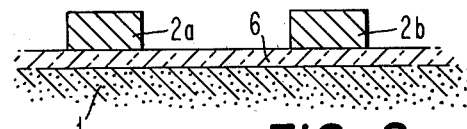
FIG. 2c
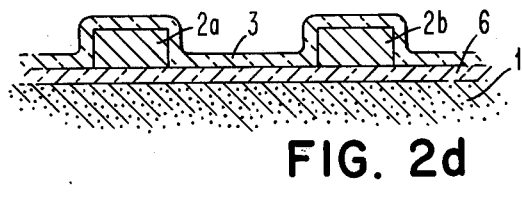
FIG. 2d
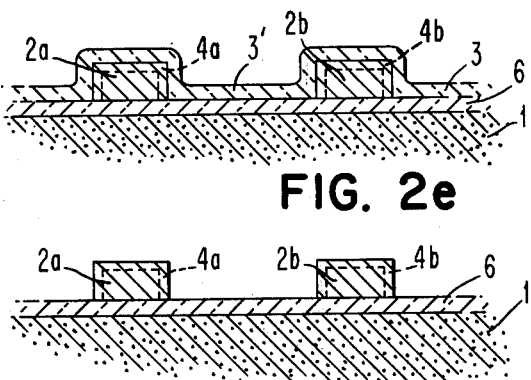
FIG. 2e
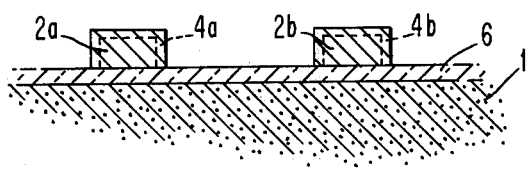
FIG. 2f

PROCESS FOR FORMING A LEDGE-FREE ALUMINUM-COPPER-SILICON CONDUCTOR STRUCTURE

FIELD OF THE INVENTION

The invention disclosed relates to semiconductor device processing and more particularly relates to a process for forming an aluminum-copper-silicon conductor structure.

BACKGROUND OF THE INVENTION

Aluminum-copper metallurgy has been used in the prior art to avoid the electromigration problem, as is discussed, for example, by Hall, et al., in U.S. Pat. No. 3,743,894.

In the fabrication of semiconductor device, a contact metal layer of aluminum is generally used to make ohmic contact to the device. When the device is operated under high current and high temperature conditions, the aluminum contact metal is transported by the current flowing therethrough causing the metal to build up in some areas and to form voids in others. The voids can become large enough to sufficiently increase the resistance of the metal contact in the area where the voids occur to allow resistive heating to cause the contact metal to melt, thereby causing premature failure of the device.

Hall, et al., teaches that to avoid the electromigration problem, aluminum contact metallization is codeposited with a small percentage of copper on the order of 1 to 10 percent by weight. Forming a fine grain structure of $CuAl_2$ grains having a diameter of less than 1,000 Angstroms interspersed between aluminum grains at the grain boundaries and triple points thereof.

Silicon has been alloyed with the aluminum-copper in the prior art to prevent the aluminum-copper from penetrating into the silicon substrate as is discussed, for example, by Kuiper in U.S. Pat. No. 3,382,568.

In the fabrication of silicon devices with aluminum lands, some surface passivations of silicon planar devices, e.g., glass coating, require heat exposure of the device to a temperature just below the silicon-aluminum eutectic temperature. Under some conditions, silicon from the wafer will be dissolved in the aluminum at a temperature as much as 15 degrees below the eutectic temperature, thereby resulting in higher land resistances and an unreliable device.

One hypothesis is that a stress mechanism between $SiO_2$ and SI plays a part in this effect. Aluminum and silicon in initmate contact from a eutectic, a liquid alloy, at approximately 577° C. Therefore, glassing is restricted to temperatures below 577° C. When a silicon device has lands running from a contact hole in the oxide to a distant point on the oxide over the oxide layer and the device is glassed at 570° C., problems arise at the stepdown where the aluminum contact stripe traverses from the oxide to the silicon. The problems are phenomena such as "necking down" or breaking of the stripe and deep vertical or lateral penetrations of the silicon by the aluminum. The electrical consequences of such behavior are, in the former instance, high resistance points which burn out and open under electrical load, or in the later case, short circuiting of the junction. The foregoing shortcomings are overcome by Kuiper through evaporating a small amount of silicon with the aluminum during the evaporation step for the formation of conductors, contacts and lands on the silicon device. It is required that the silicon be evaporated quite close to the plane of aluminum silicon contact. The small amounts of silicon thus mixed with the aluminum prevent subsequent diffusion of further amounts of silicon into the aluminum lands, lines and stepdown portions therebetween.

In the existing process for etching the aluminum-copper-silicon conductor structures, a layer of photoresist having the desired pattern is formed on the surface of the aluminum, copper, silicon composite. Thus, a phosphoric acid-nitric acid/hydrofluoric acid solution is employed at room temperature with the objective of removing the silicon layer, forming the desired pattern therein. This process step often results in leaving a silicon residue on a surface of the conductor layer because of the lack of uniformity in thickness of the silicon layer and the poor silicon etching characteristic of the etchant. Etching for extended periods with the silicon etchant results in under cutting the remaining silicon beneath the photoresist layer. The second step in the existing process employs a standard aluminum-copper etch solution of phosphoric acid and nitric acid. When the silicon layer has not been uniformly removed from the surface of the conductor layer by the previous step, aluminum-copper is etched out from beneath the unetched silicon leaving silicon projections and islands. Even when the silicon layer is uniformly removed, the aluminum-copper etchant undercuts beneath the silicon layer remaining beneath the photoresist, forming undesirable ledges. This can result in shorted conductors in the resulting product.

In the prior art, often several ultrasonic cleaning steps are required using a suitable solvent, in the attempt to remove the residue and ledges from the silicon layer. But this cleaning operation yeilds unrelaible results and indeed frequently induces stress cracking in the device structure. After this step, the silicon is sintered into the aluminum-copper, as described above.

OBJECTS OF THE INVENTION

It is therefore an object of the invention to make an improved ledge-free conductor.

It is another object of the invention to make a ledge-free aluminum-copper-silicon conductor in an improved manner.

It is still another object of the invention to make an aluminum-copper-silicon conductor which is free of silicon bridging.

It is yet another object to eliminate ultrasonic cleaning steps in the removal of silicon layer ledges and residues. It is still another object of the invention to reduce the number of wet etching steps in the formation of an aluminum-copper-silicon conductor.

SUMMARY OF THE INVENTION

These and other objects, features and advantages of the invention are accomplished by the process for forming a ledge-free aluminum-copper-silicon conductor structure disclosed herein. The inventive process comprises the steps of depositing the aluminum-copper metallurgy, depositing a photoresist layer to delineate the shape of the resulting conductors, etching the aluminum-copper metallurgy with phosphoric/nitric acid, for example, removing the photoresist, evaporating a layer of silicon on the surface of the etched conductor layer, sintering the composite to drive the necessary amount of silicon into the aluminum-copper, and removing the residual silicon layer by a reactive plasma etching technique. The resulting conductor structure is then free of silicon ledges and bridging.

DESCRIPTION OF THE FIGURES

The details of the invention disclosed can be more readily appreciated by reference to the accompanying drawings.

FIG. 1 is a flow diagram of the process invention.

FIGs. 2a-2f are cross-sectional views of an aluminum-copper-silicon conductor undergoing formation by the process of FIG. 1.

DESCRIPTION OF THE PREFERRED EMBODIMENT

The inventive process for forming a ledge-free aluminum-copper-silicon conductor structure comprises the steps shown in the process flow diagram of FIG. 1. Step 1 comprises the formation of the insulator layer 6 on the silicon substrate 1. The insulator layer 6 may be silicon dioxide which may be formed through thermal growth techniques, sputtering, or other conventional processes. The insulator 6 may also be silicon nitride or other suitable insulators used in the semiconductor art. The thickness range for the layer 6 is from 100 to 10,000 Angstroms.

FIG. 2b comprises the deposition of the aluminum-copper alloy layer onto the surface of the insulator layer 6. The composition of the aluminum-copper alloy can be in the range of from 1 to 7 percent copper. The thickness of the aluminum-copper layer can be in the range of typically from 2,000 to 20,000 Angstroms. The aluminum-copper metallurgy has been used in the prior art to avoid the electromigration problem.

FIG. 2c illustrates step 3 of the process of FIG. 1 showing the etching of the aluminum-copper layer 2 so as to delineate the shapes 2a and 2b for example, of conductors to be used, for example, in a large scale integrated circuit. This step is accomplished by depositing a layer of photoresist over the top of the unetched aluminum-copper layer 2 in FIG. 2b, exposing the deposited photoresist to a light image of the conductors desired, developing the photoresist layer, and then etching the aluminum-copper layer with a standard etching solution of phosphoric and nitric acid.

FIG. 2d illustrates step 4 of the process of FIG. 1, depositing the silicon layer 3 on all exposed surfaces after the removal of the photoresist layer in the preceeding step. The deposition process for the silicon layer 3 may be an e-beam technique, sputtering, or resistance heating. The thickness of the silicon layer 3 is in the range of typically 100 to 1,000 Angstroms.

FIG. 2e illustrates step 5 of the process of FIG. 1, wherein the composite of FIG. 2d is raised in temperature to sinter the composite and alloy the portion of the silicon from layer 3 into the region 4a or 4b in the periphery of the conductors 2a and 2b, respectively. The sintering temperature for step 5 can lie in the range of 300° to 500° C and in particular can be 400° C for 65 minutes or 425° C for 20 minutes.

In should be noted that prior art problems with silicon bridging between adjacent conductors of aluminum-copper-silicon composition have occurred because of the nonuniform removal of the region 3' of the silicon layer 3 shown in FIG. 2e. It is a substantial advantage of the process disclosed herein that it cleanly removes bridging regions 3' of silicon between adjacent conductors so processed.

FIG. 2f illustrates step 6 of the process of FIG. 1 wherein a reactive plasma etch is performed to remove the residual portion of the silicon layer 3 from surfaces of the conductors 2a and 2b and from the surface of the insulator layers 6. The reactive plasma etching step can be accomplished by flowing a gaseous mixture of carbon tetrafluoride and about 8 percent oxygen over the surface of the silicon layer 3 while exposing the gaseous mixture to a radio frequency excitation in a plasma etching chamber. The mixture can flow at a flow rate of approximately 50 cubic centimeters per minute. The radio frequency excitation can be applied at approximately 300 watts of radio frequency power. The reactive plasma etching step may be stopped after approximately 15 seconds of exposure of the silicon layer 3 thereto. There results a ledge-free conductor structure 2a and 2b in FIG. 2f which is free of silicon bridging such as has produced electrical shorting in aluminum-copper-silicon conductors formed by prior art techniques.

The process is a radical departure from standard processing of aluminum-copper-silicon composites, but some unique advantages are offered. First, wafers start with Al-Cu metallurgy. Standard techniques are to be used to etch the Al-Cu prior to the deposition of the silicon-layer. In this state the conductor pattern can still be easily reworked, an advantage not available after the silicon layer is applied. Then after the photoresist is removed, blanket silicon is evaporated on the wafers. Next the wafers are sintered to drive the necessary amount of silicon into the Al-Cu. (About 0.5 percent silicon is required to prevent junction penetration depending upon maximum temperature in subsequent heat treating steps). Silicon on other parts of the wafer remains on the oxide. (Silicon diffuses considerably more freely in aluminum than in $SiO_2$). The final reactive plasma etching step is required to remove the silicon from the top of the oxide. The silicon ledges which have been formed in prior art processes are never formed in the instant process because there is no wet etching step after the deposition of the silicon which would result in undercutting the silicon layer. This is accomplished by an approximately 15 second etch in the reactive plasma etcher. This cycle easily removes the silicon and leaves the oxide relatively untouched. It is estimated that less than 30 Angstroms of oxide would be removed by the plasma cycle.

The process disclosed represents an improvement in etching ledge-free aluminum-copper-silicon conductor layers, which precludes the formation of residual silicon bridging islands which can cause subsequent shorting failures in the resulting semiconductor device.

Alternate dry, ion etching methods, such as sputter etching or reactive ion etching can be employed with substantially similar results by the preferred reactive plasma etching process.

While the invention has been particularly shown and described with reference to the preferred embodiments thereof, it will be understood by those skilled in the art that the foregoing and other changes in form and details may be made therein without departing from the spirit and scope of the invention.

We claim:

1. A process for forming a ledge-free aluminum-silicon conductor structure, comprising:
   depositing a blanket layer of aluminum over the surface of a semiconductor substrate;
   etching the aluminum layer to delineate the desired conductor shape;

depositing a blanket layer of silicon over the surface of the substrate and on the delineated aluminum layer;

sintering the silicon layer and aluminum layer to alloy a portion of said silicon layer with said aluminum layer;

removing the unalloyed portion of said silicon layer by a dry, ion etching technique.

2. The method of claim 1 which further comprises:

the step of forming an oxide layer in selected areas on the surface of said semiconductor substrate prior to said step of depositing said aluminum layer.

3. The method of claim 1 which further comprises:

the step of applying a layer of photoresist so as to delineate the shape of the aluminum layer, prior to said step of etching said aluminum layer.

4. The method of claim 1, wherein said dry, ion etching technique is sputter etching.

5. The method of claim 1, wherein said dry, ion etching technique is reactive ion etching.

6. The method of claim 1, wherein said dry, ion etching technique is reactive plasma etching.

7. The method of claim 6, wherein said reactive plasma etching step further comprises:

flowing a gaseous mixture of carbon tetrafluoride and oxygen over the surface of said silicon layer while exposing said mixture to radio frequency excitation.

8. The method of claim 7, wherein said reactive plasma etching step further comprises:

flowing said mixture at a flow rate of approximately 50 cubic centimeters per minute, exposing said silicon layer to approximately 300 watts of radio frequency power, and stopping said reactive plasma etching step after approximately 15 seconds of exposure.

9. A process for forming ledge-free aluminum-copper-silicon conductor structure, comprising:

depositing a blanket layer of aluminum-copper over the surface of a semiconductor substrate;

etching the aluminum-copper layer to delineate the desired conductor shape;

depositing a blanket layer of silicon over the surface of the substrate and on the delineated aluminum-copper layer;

sintering the silicon layer and aluminum-copper layer to alloy a portion of said silicon layer with said aluminum-copper layer;

removing the unalloyed portion of said silicon layer by a dry, ion etching technique.

10. The method of claim 9 which further comprises:

the step of forming an oxide layer in selected areas on the surface of said semiconductor substrate prior to said step of depositing said aluminum-copper layer.

11. The method of claim 9 which further comprises:

the step of applying a layer of photoresist so as to delineate the shape of the aluminum-copper layer, prior to said step of etching said aluminum-copper layer.

12. The method of claim 9, wherein said dry, ion etching technique is sputter etching.

13. The method of claim 9, wherein said dry, ion etching technique is reactive ion etching.

14. The method of claim 9, wherein said dry, ion etching technique is reactive plasma etching.

15. The method of claim 14, wherein said reactive plasma etching step further comprises:

flowing a gaseous mixture of carbon tetrafluoride and oxygen over the surface of said silicon layer while exposing said mixture to radio frequency excitation.

16. The method of claim 15, wherein said reactive plasma etching step further comprises:

flowing said mixture at a flow rate of approximately 50 cubic centimeters per minute, exposing said silicon layer to approximately 300 watts of radio frequency power, and stopping said reactive plasma etching step after approximately 15 seconds of exposure.

* * * * *